United States Patent [19]

Mann

[11] Patent Number: 5,867,448
[45] Date of Patent: Feb. 2, 1999

[54] BUFFER FOR MEMORY MODULES WITH TRACE DELAY COMPENSATION

[75] Inventor: Eric N. Mann, Issaquah, Wash.

[73] Assignee: Cypress Semiconductor Corp., San Jose, Calif.

[21] Appl. No.: 873,005

[22] Filed: Jun. 11, 1997

[51] Int. Cl.$^6$ .................... G11C 8/00; G11C 5/02
[52] U.S. Cl. ................ 365/233; 365/194; 365/52
[58] Field of Search ................. 365/233, 194, 365/51, 52, 63; 327/261, 269, 270

[56] References Cited

U.S. PATENT DOCUMENTS

| | | | |
|---|---|---|---|
| 5,077,693 | 12/1991 | Hardee | 365/233 |
| 5,495,435 | 2/1996 | Sugahara | 365/52 |
| 5,513,135 | 4/1996 | Dell et al. | 365/52 |
| 5,577,236 | 11/1996 | Johnson | 395/551 |

OTHER PUBLICATIONS

Everything You Need To Know About CY7B991/CY7B992 (RoboClock) But Were Afraid To Ask; Jun. 24, 1996. pp. 6–1 to 6–39; Cypress Semiconductor Summer 1996 CD–ROM.

*Primary Examiner*—Son Mai
*Attorney, Agent, or Firm*—Maiorana & Acosta, P.C.; Christopher P. Maiorana

[57] ABSTRACT

A circuit comprising a generation circuit for providing a clock signal. A number of compensation circuits may receive the clock signal and may present essentially simultaneously a compensated clock signal at their outputs. The compensated clock signals are generally presented to a plurality of synchronous external devices.

20 Claims, 3 Drawing Sheets

BUFFER FOR MEMORY MODULES WITH TRACE DELAY COMPENSATION

FIELD OF THE INVENTION

The present invention relates to memory circuits generally and, more particularly, to a buffer for use with clock signals in memory modules to provide trace delay compensation.

BACKGROUND OF THE INVENTION

Certain conventional memory modules have a common input clock signal that is presented to a number of discrete chips that make up a particular product. A dual in line memory module (DIMM) is one example of such a conventional approach. If the input clock signal is presented to each of the individually clocked chips located at different portions of the DIMM, the particular traces used to connect the clock to the individual memory modules generally have different lengths. As a result, one generally compensates for the varying distances of the particular chips from the clock circuit in a DIMM module.

A conventional approach to reducing board design clock skew is to make the physical length of each of the traces to the particular modules equal. The propagation delay of an electrical signal down a particular trace is generally a fixed amount per length of the trace. As a result, if a particular trace is slightly longer than another trace, an undesirable clock skew will result. The clock skew due to different trace lengths may be as much as the skew contributed by the clock driver that generates the original clock signal.

Referring to FIG. 1, a memory module 10 is shown implementing such an approach. The memory module 10 generally comprises a circuit board portion 12, a clock buffer 14 and a number of discrete memory modules 16a–n. The clock buffer 14 receives an input clock signal CLK. Each of the individual memory modules 16a–n is physically located at a particular and distinct distance from the clock buffer 14. The memory module 16a is shown located the furthest distance from the clock buffer 14. As a result, a trace 18a is shown connected directly between the memory module 16a and the clock buffer 14. The memory module 16b is located slightly closer to the clock buffer 14. As a result, the trace 18b is shown have a serpentine portion 20b. The serpentine portion 20b provides compensation for the reduced physical distance between the clock buffer 14 and the memory module 16b by increasing the overall length of the trace 18b. The overall length of the trace 18a is generally equal to the overall length of the trace 18b. As a result, the overall signal propagation delay in each of the traces 18a and 18b is generally equal, which allows the memory module 10 to function properly. Each of the traces 18c–n has corresponding serpentine portions 20c–g. However, the trace 18n does not have a corresponding serpentine portion, which is similar to the trace 18a.

A disadvantage with the memory module 10 shown in FIG. 1 is the module area allocated to each of the serpentine portions 20b–20g. As a result, the overall size of the memory module 10 may increase relative to an otherwise identical scheme.

Another conventional approach provides a clock driver having one or more outputs that are phase aligned to an input clock using an integrated phase locked loop (PLL). With this approach, the output can be maintained with a very low propagation delay from the input of the device. The PLL approach generally requires the PLL output to be fed back to the PLL input. A phase frequency detector (PFD) generally causes a voltage controlled oscillator (VCO) to run faster or slower based on the relationship between the input and the outputs. Such a conventional approach may be designed to select or produce an output frequency within a predetermined frequency range. Since all of the outputs switch simultaneously, it is still necessary to serpentine module wiring to account for different distances between memory devices.

SUMMARY OF THE INVENTION

The present invention concerns a circuit configured to generate a clock signal. The clock signal may be presented to a number of compensation circuits. Each of the compensation circuits may be configured to present a compensated clock signal. Each of the compensated clock signals may be presented to a number of outputs.

It is an object of the present invention to provide a clock module which presents clock signals (e.g., suitable for use in a memory module) where each clock signal has a predetermined delay to compensate for differences (e.g., in timing and/or length) in the signal paths between the particular modules.

Other objects, features and advantages of the present invention include providing a clock generation chip in a memory module where a plurality of clock signals, each having a predetermined delay, are presented to a plurality of memory chips at essentially the same time.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
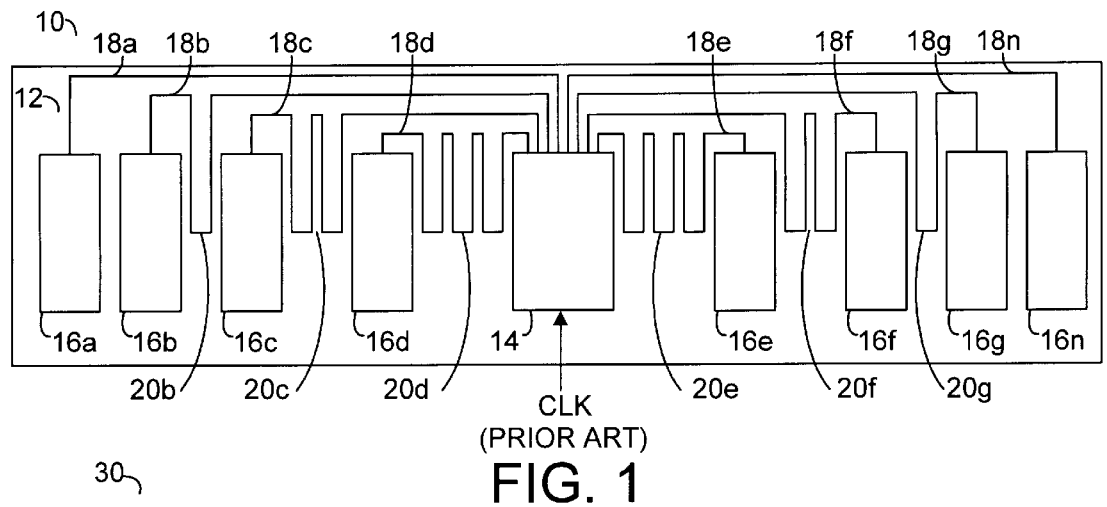
FIG. 1 is a diagram of a conventional memory module.

Referring to FIG. 2, a block diagram of a clock circuit 30 (which may be implemented as a discrete integrated circuit) is shown in accordance with a preferred embodiment of the present invention. The clock chip (or circuit) 30 has an output 32, an output 34, an output 36, an output 38, an output 40, an output 42, an output 44 and an output 46. Each of the outputs 32–46 may be configured to provide a clock signal having a particular delay. The particular number of outputs 32–46 may be adjusted to meet the design criteria of a particular application. Additionally the particular delay at each of the outputs 32–46 may be adjusted to meet the design criteria of a particular application. The clock chip 30 also comprises a delay section 50, a delay section 52, a delay section 54, a delay section 56, a delay section 58, a delay section 60, a delay section 62 and a delay section 64. The delay sections 50–64 generally comprise compensation circuits. The particular number of delay sections (or circuits) 50–64 may be adjusted to meet the design criteria of particular application.

Figure 2A:
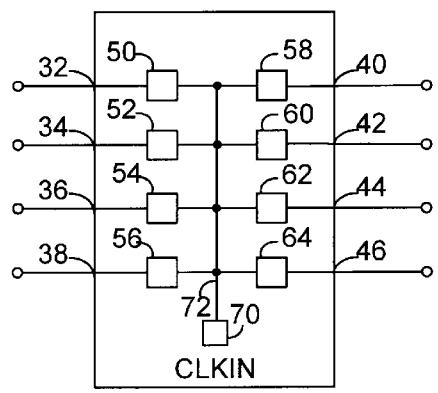
FIGS. 2a and 2b show block diagrams of preferred embodiments of the present invention.

A clock generation section (or circuit) 70 generally presents a clock signal (e.g., CLKIN) to a clock trace 72. The clock trace 72 may be coupled to each of the trace delay sections 50–64. In FIG. 2a, the delay sections 50–64 may receive the clock signal CLKIN from the clock trace 72. Each of the delay sections 50–64 may present a delay compensated clock signal at the output 32. The amount of delay presented by the trace delay section 50 may be adjusted to meet the design criteria of particular application. The present invention may also be practiced as a method of compensating for delays in a clocked/synchronous module comprising the steps of (a) generating a clock signal, and (b) transmitting the clock signal to at least one of a plurality of memory chips such that a clock signal is received by the chips at essentially the same time. The transmitting step may comprise transmitting the clock signal through a plurality of traces having equivalent signal transmission rates or programmable delays. The memory chips may comprise RAM modules.

Figure 2B:
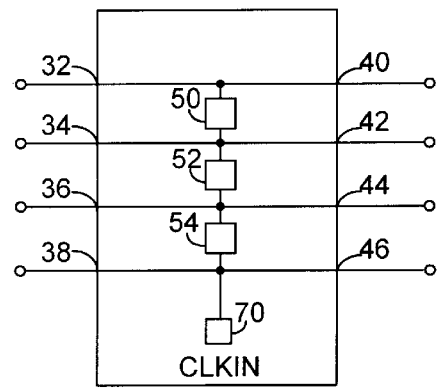

Each of the delay sections 50–64 may introduce a particular, distinct and/or characteristic amount of delay to the signal CLK as it propagates from clock trace 72 to each of the outputs 32–46. However, each of the delay sections 50–64 may delay the clock signal by a fixed increment of time. For example, the delay sections 56 and 64 may delay the signal CLK by a first fixed increment of time, the delay sections 54 and 62 by a second fixed increment, the delay sections 52 and 60 by a third fixed increment, and the delay sections 50 and 58 by a fourth fixed increment, where the second, third and/or fourth fixed increments may be a multiple of the first fixed increment. The increments are typically in the range of 50 ps to 1 ns. However, any other increment necessary for a particular design application may be used. In one specific embodiment, the delay increment is about 105 ps. FIG. 2b illustrates an alternate configuration implementing a single delay section (e.g., 50, 52 or 54) to provide compensation for two outputs (e.g., outputs 32 and 40, outputs 34 and 42, etc).

Figure 3:
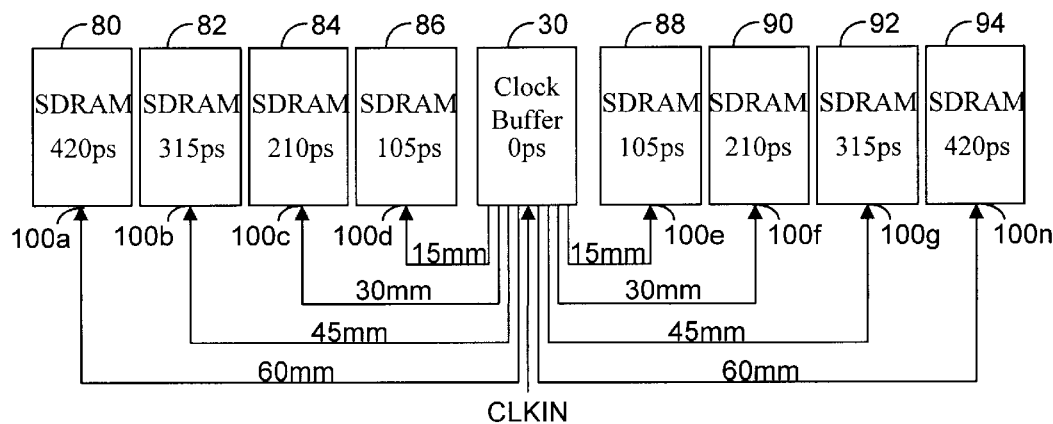
FIG. 3 is a block diagram showing a preferred embodiment of the present invention implemented on a memory module.

Referring to FIG. 3, the clock chip 30 is shown incorporated into an array of memory chips. FIG. 3 shows a memory chip 80, a memory chip 82, a memory chip 84, a memory chip 86, a memory chip 88, a memory chip 90, a memory chip 92 and a memory chip 94. Each of the memory chips 80–94 may be implemented as a dynamic random access memory (DRAM) chip (which is preferred a synchronous DRAM), a static random access memory (SRAM) chip or any other type of memory chip that advantageously receives a clock signal for one or more functions in the module (e.g., refresh, reading, writing, precharging, etc). The number of memory chips 80–94 may be adjusted to meet the design criteria of particular application and may be related to the number of outputs 32–46. Each of the memory chips 80–94 is shown generally having an input 100a–n. Each of the inputs 100a–n may receive one of the delay compensated clock signals from one of the outputs 32–46 (shown in FIG. 2) of the clock chip 30. The input 100a, for example, may receive the delay compensated clock signal from the output 32 of FIG. 2. The input 100b may receive a compensated clock signal from the output 34. The particular outputs 32–46 that are presented to the particular inputs 100a–n may be adjusted to meet the design criteria of particular application. Additionally, a single output 32–46 may be presented to one or more inputs 100a–n in a configuration where one or more memory chips 80–94 have a similar spacing. The particular configuration of the memory chips 80–94 may be varied. For example, the clock chip 30 may be located on one side of the memory chips 80–94, rather than having an equal number of chips on either side of the clock chip 30. Additionally, the memory chips may be arranged in an array fashion. For example, three of the memory chips may be implemented in a first row, while three additional memory chips may implement a second row and three additional memory chips may implement a third row. In such a configuration the clock chip functions in a similar fashion where a particular delay is presented to the trace clocking the particular memory chip 80–94.

Figure 4:
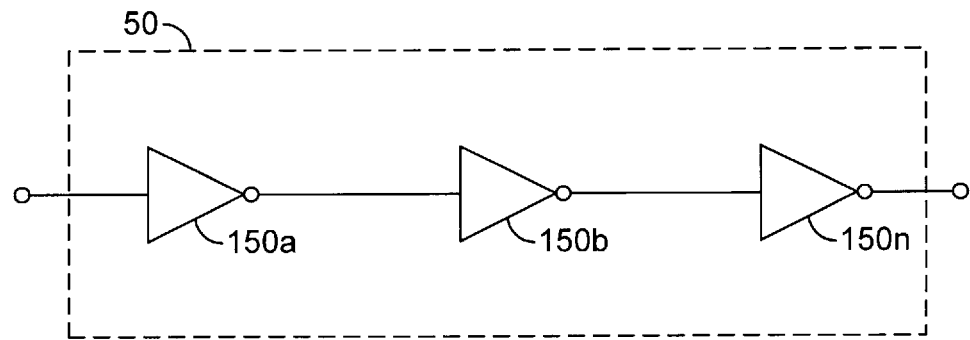
FIG. 4 is a circuit diagram of a compensation section in a preferred embodiment of the present invention.

Referring to FIG. 4, a circuit diagram for a particular delay section 50 is shown. The delay section 50 may correspond to any of the delay sections 50–64 in FIG. 2. The particular delay section 50 may be implemented in a variety of ways. In one embodiment, a number of inverters in series may provide the particular amount of trace delay required. The inverters may be, in one implementation, CMOS inverters. The number of CMOS inverters may be, in one example, a number greater than or equal to 1. In another example, the number of inverters may be equal to 2 n, where n is an integer greater than or equal to 1. FIG. 4 illustrates a particular trace delay section 50 implemented as three cascaded inverters.

The trace delay section 50 is shown having an inverter 150a, an inverter 150b and an inverter 150n. The number of inverters 150a–n may determine the amount of delay at the output. To maintain signal polarity through the delay section 50, an even number of inverters 150a–n may be implemented or the input signal may be inverted.

In a further embodiment, the delay sections 50–66 may comprise a programmable delay element. A programmable delay may allow post-production configuration of the delays. This post-production configuration may allow a particular clock chip 30 to be used in a variety of design applications.

Figure 5:
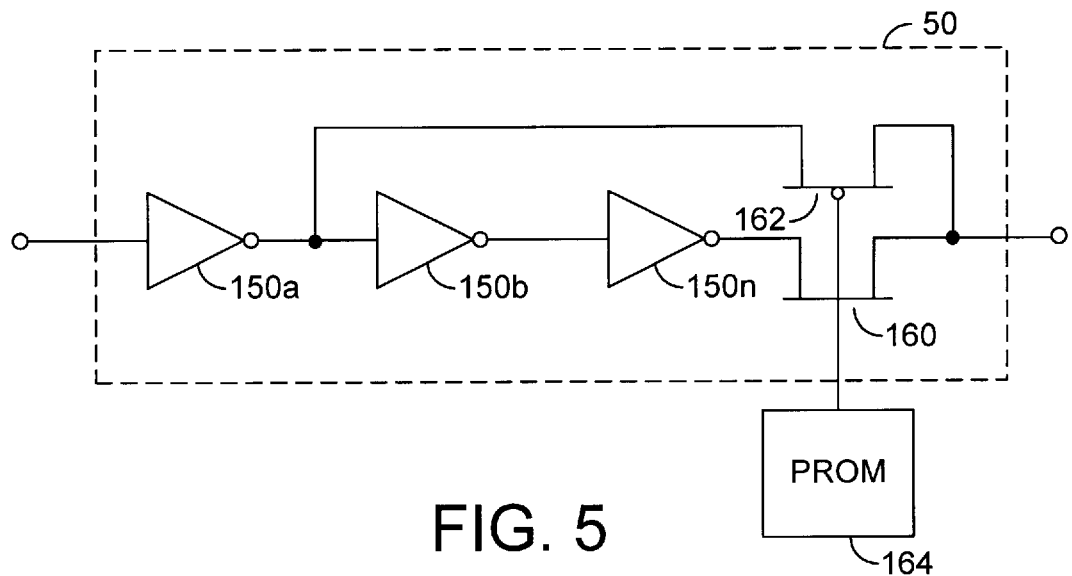
FIG. 5 is an example of a programmable delay.

Referring to FIG. 5, an alternate embodiment of the delay section 50 is shown implementing one example of a programmable element. A transistor 160 and a transistor 162 are shown implemented between the inverters 150a and 150b, respectively. A first path may be created through the inverter 150a and the inverter 150b when the transistor 160 is on and the transistor 162 is off. A second path may be created through the inverter 150a and the transistor 162 when the transistor 160 is off and the transistor 162 is on. By implementing the transistor 160 as an n-channel transistor and the transistor 162 has a p-channel transistor, only one of the two paths is generally enabled at a particular time. A programmable read-only memory (PROM) may be implemented to provide the control signal to select the particular path. FIG. 5 is one example of a programmable delay. Other programmable delays may be implemented to meet the design criteria of a particular application.

Figure 6:
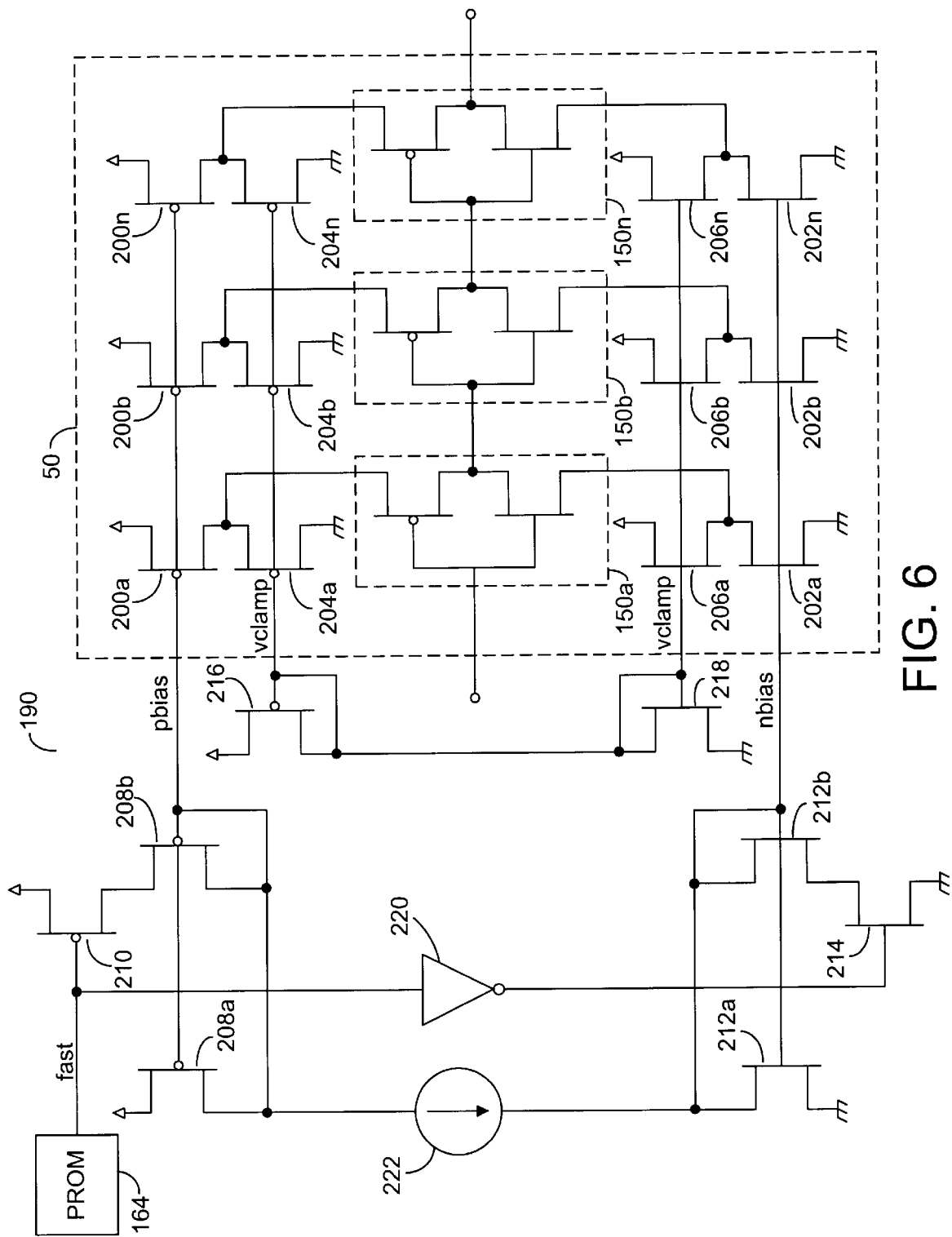
FIG. 6 is an alternate example of a programmable delay.

Referring to FIG. 6, a second alternate embodiment implementation of a delay element 190 is shown where the particular delay may be adjusted. A number of conventional CMOS inverters 150a–150n may be enhanced with the addition of bias circuitry to control the current and voltage swing of the inverters. The delay element 190 has the advantage of presenting a more predictable delay than a simple inverter, but may require more die area to implement.

A number of transistors 200a–200n may form current sources which may follow a current mirror formed by a current source 222, a transistor 208a and a transistor 208b. The ratio of current flowing in the current mirror may be varied by turning a switch transistor 210 on and off. If the transistor 208a and 208b are the same size, the current sources have two times the current when the switch transistor 210 is off than when it is on, making the delay about twice as fast when the switch transistor 210 is off. The transistors 202a–202n may form a similar current source to ground, using a current source 222 with a current mirror 212a and 212b along with a transistor switch 214 used to vary the current (and thus speed). The transistors 204a–204n and the transistors 206a–206n may limit the swing of the inverters 150a–150n by clamping the current source voltages to approximately a voltage Vclamp +/– the CMOS transistor threshold voltage. The transistors 216 and 218 may form a voltage divider which may generate the Vclamp voltage. The inverters 150a–150n may have propagation delays proportional to the voltage swing, switching current, and load capacitance. The circuit 190, may provide, the voltage swing, switching current, and load capacitance which may be approximately constant, resulting in constant delays over a variety of operating conditions. By adjusting the current (e.g., by using the transistors 210 and 214 along with the inverter 220) the delay may be adjusted. While FIG. 6 may illustrate one example of a programmable delay element, other delay elements may be implemented to meet the design criteria of a particular application.

While the invention has been particularly shown and described with reference to the preferred embodiments thereof, it will be understood by those skilled in the art that various changes in form and details may be made without departing from the spirit and scope of the invention.

I claim:

1. A circuit comprising:
    a clock generation circuit configured to provide a clock signal; and
    a plurality of first compensation circuits, each configured to (i) receive said clock signal and (ii) present a first compensated clock signal at one or more first clock outputs, each first compensation circuit having a first delay to compensate a difference between (a) a first signal path between one of said first clock outputs and a first device receiving the first compensated clock signal and (b) a second signal path between another first circuit output and a second, distinct device receiving a signal from said first circuit output.

2. The circuit according to claim 1, wherein said signal from said first circuit output is an uncompensated clock signal or a second compensated clock signal distinct from said first compensated clock signal.

3. The circuit according to claim 1 wherein each of said compensated clock signals has a predetermined delay.

4. The circuit according to claim 1 wherein said devices comprise memory chips on a module.

5. The circuit according to claim 4 wherein said memory chips comprise dynamic random access memory (DRAM) chips.

6. The circuit according to claim 4 wherein said memory chips comprise synchronous dynamic random access memory (SDRAM) chips.

7. The circuit according to claim 1, further comprising a plurality of second compensation circuits, each configured to (i) receive said clock signal and (ii) present a second compensated clock signal at one or more second clock outputs, each second compensation circuit having a second delay different from said first delay to compensate for a difference between (a) a third signal path between one of said second clock outputs and a third device receiving the second compensated clock signal and (b) one of said first and second signal paths.

8. The circuit according to claim 7 wherein the difference between said first and second delays is from 50 ps to 400 ps.

9. The circuit according to claim 7 wherein said memory chips comprise synchronous random access memory chips.

10. The circuit according to claim 1 wherein at least one of said compensation circuits comprise a programmable delay element.

11. The circuit according to claim 1 wherein said compensation circuits comprise one or more inverters.

12. A circuit comprising:
    a clock generation circuit configured to provide a clock signal; and
    a first compensation circuit configured to (i) receive said clock signal and (ii) present a plurality of first compensated clock signals at a corresponding plurality of first clock outputs, said first compensation circuit having a first delay to compensate for a difference between (a) a first signal path between said first clock outputs and a first device receiving the first compensated clock signal and (b) a second signal path between a first circuit output and a second, distinct device receiving a signal from said first circuit output.

13. The circuit according to claim 12 wherein said first and second devices comprise a plurality of memory chips on a memory module.

14. The circuit according to claim 12, wherein said signal from said first circuit output is an uncompensated clock signal or a second compensated clock signal distinct from said first compensated clock signal.

15. The circuit according to claim 14 wherein the difference between said first delay and said second delay is less than 500 ps.

16. The circuit according to claim 14 wherein said first and second delays are the same.

17. A method of compensating for delays in a clocked/synchronous module comprising the steps of:
    (A) generating a clock signal; and
    (B) in response to said clock signal, generating a plurality of compensated clock signals to a plurality of memory chips on a module, said compensated clock signals compensating for differences between a plurality of signal paths to said memory chips such that said compensated clock signals are received by all memory chips on the module at essentially the same time.

18. The method according to claim 17 wherein said memory chips comprise synchronous RAM modules.

19. The method according to claim 18 wherein step (B) comprises transmitting said clock signal through a plurality of traces having: (i) equivalent signal transmission rates or (ii) programmable delays.

20. The circuit according to claim 7, wherein said first and second delays are the same.

* * * * *